United States Patent
Xie et al.

(10) Patent No.: US 11,204,828 B2
(45) Date of Patent: Dec. 21, 2021

(54) MANAGEMENT OF CORRUPTIVE READ IN MEMORY SYSTEMS

(71) Applicant: Micron Technology, Inc., Boise, ID (US)

(72) Inventors: Tingjun Xie, Milpitas, CA (US); Zhengang Chen, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 69 days.

(21) Appl. No.: 16/215,248

(22) Filed: Dec. 10, 2018

(65) Prior Publication Data

US 2020/0183783 A1   Jun. 11, 2020

(51) Int. Cl.

| | |
|---|---|
| *G06F 11/10* | (2006.01) |
| *G11C 16/26* | (2006.01) |
| *G11C 16/10* | (2006.01) |
| *G06F 3/06* | (2006.01) |
| *G11C 29/52* | (2006.01) |
| *G11C 16/04* | (2006.01) |

(52) U.S. Cl.
CPC ........ *G06F 11/1068* (2013.01); *G06F 3/0619* (2013.01); *G06F 3/0659* (2013.01); *G06F 3/0679* (2013.01); *G11C 16/10* (2013.01); *G11C 16/26* (2013.01); *G11C 29/52* (2013.01); *G11C 16/0483* (2013.01)

(58) Field of Classification Search
CPC .. G06F 11/1068; G06F 3/0619; G06F 3/0659; G11C 16/10; G11C 29/52; G11C 16/26; G11C 16/0483
USPC .......................................................... 714/764
See application file for complete search history.

(56) References Cited

U.S. PATENT DOCUMENTS

| | | | |
|---|---|---|---|
| 2007/0091677 A1 | 4/2007 | Lasser et al. | |
| 2012/0254699 A1* | 10/2012 | Ruby | G11C 29/028 |
| | | | 714/773 |
| 2014/0153330 A1* | 6/2014 | Yoon | G11C 16/0483 |
| | | | 365/185.03 |
| 2015/0117107 A1* | 4/2015 | Sun | G11C 16/225 |
| | | | 365/185.12 |

(Continued)

OTHER PUBLICATIONS

International Search Report and Written Opinion dated Mar. 27, 2020, on Application No. PCT/US2019/064693.

(Continued)

*Primary Examiner* — James C Kerveros
(74) *Attorney, Agent, or Firm* — Lowenstein Sandler LLP

(57) ABSTRACT

Described herein are embodiments related to one-direction error recovery flow (ERF) operations on memory components of memory systems. A processing device determines that data from a read operation is not successfully decoded because of a partial write of the data. The partial write results from a number of memory cells written as a first state and read as a second state. The processing device performs a one-direction ERF on the memory cells by monotonically adjusting a read voltage level for one or more re-read operations from a first discrete read voltage level towards a second read voltage level in a first direction until the data from the one or more re-read operations is successfully decoded. The first direction corresponds to an opposite direction of a state shift of the partial write. The processing device can also can determine a directional EBC and perform a refresh write if necessary.

17 Claims, 7 Drawing Sheets

(56) References Cited

U.S. PATENT DOCUMENTS

2016/0117220 A1    4/2016  Chen et al.
2016/0118129 A1    4/2016  Muchherla et al.
2016/0163392 A1    6/2016  Zhao et al.
2016/0179615 A1*   6/2016  Lee .................... G06F 11/1048
                                                                714/764

OTHER PUBLICATIONS

PCT International Preliminary Report on Patentability for PCT Application No. PCT/US2019/064693, dated Jun. 24, 2021, 7 pages.

* cited by examiner

MANAGEMENT OF CORRUPTIVE READ IN MEMORY SYSTEMS

TECHNICAL FIELD

Embodiments of the disclosure relate generally to memory sub-systems, and more specifically, relate to managing a memory sub-system including corruptive reads in the memory sub-system.

BACKGROUND

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
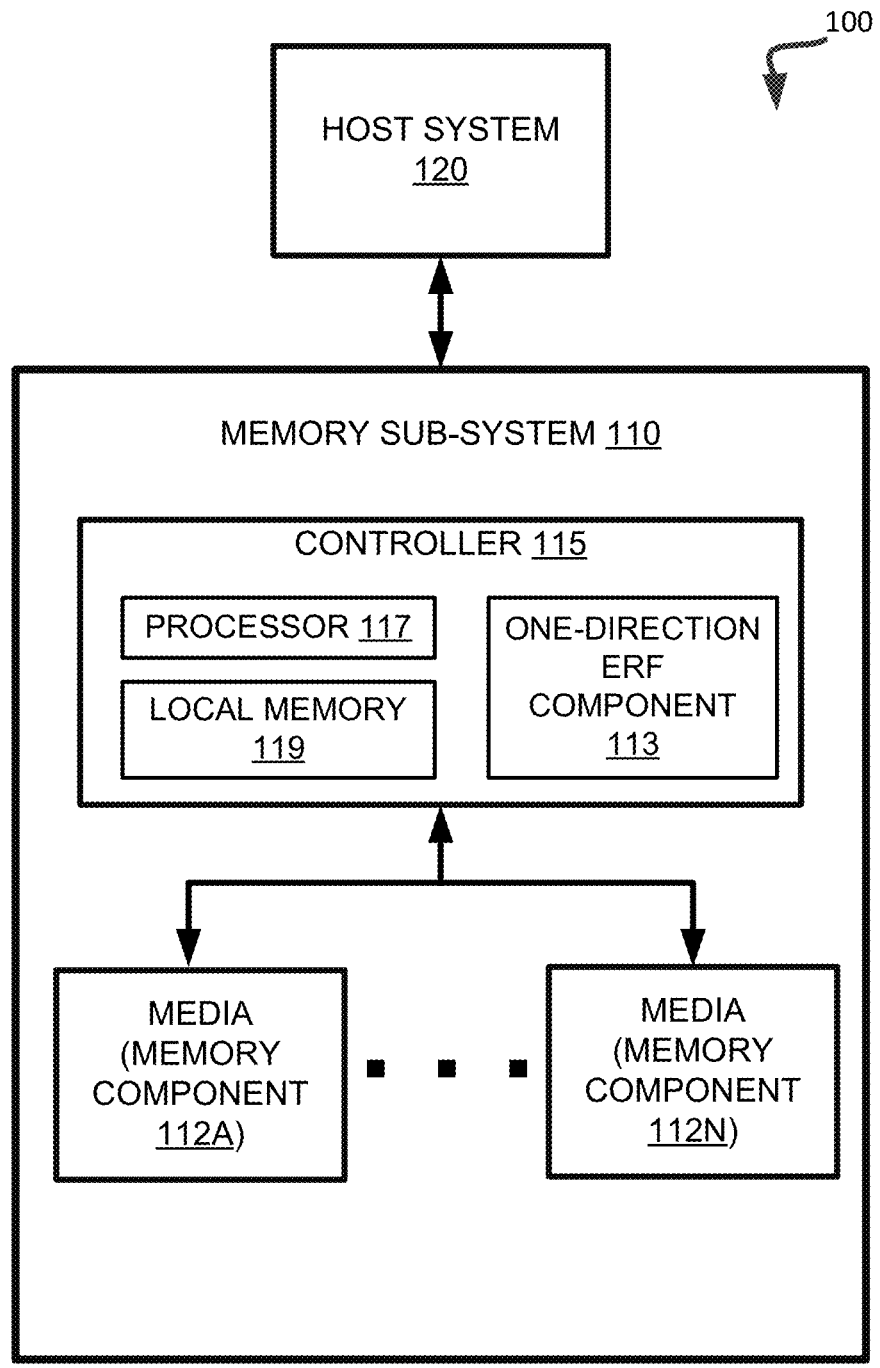
FIG. 1 illustrates an example computing environment that includes a memory sub-system in accordance with some embodiments of the present disclosure.

Aspects of the present disclosure are directed to one-direction error recovery flow (ERF) operations on memory sub-systems. A memory sub-system is also hereinafter referred to as a "memory device." An example of a memory sub-system is a storage device that is coupled to a central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). Another example of a memory sub-system is a memory module that is coupled to the CPU via a memory bus. Examples of memory modules include a dual in-line memory module (DIMM), a small outline DIMM (SO-DIMM), a non-volatile dual in-line memory module (NVDIMM), etc. In some embodiments, the memory sub-system can be a hybrid memory/storage sub-system. In general, a host system can utilize a memory sub-system that includes one or more memory components. The host system can provide data to be stored at the memory sub-system and can request data to be retrieved from the memory sub-system.

The memory sub-system can include multiple memory components that can store data from the host system. Each memory component can include a different type of media. Examples of media include, but are not limited to, a cross-point array of non-volatile memory and flash based memory such as single-level cell (SLC) memory, triple-level cell (TLC) memory, and quad-level cell (QLC) memory. The characteristics of different types of media can be different from one media type to another media type. One example of a characteristic associated with a memory component is data density. Data density corresponds to an amount of data (e.g., bits of data) that can be stored per memory cell of a memory component. Using the example of a flash based memory, a quad-level cell (QLC) can store four bits of data while a single-level cell (SLC) can store one bit of data. Accordingly, a memory component including QLC memory cells will have a higher data density than a memory component including SLC memory cells. Another example of a characteristic of a memory component is access speed. The access speed corresponds to an amount of time for the memory component to access data stored at the memory component.

Other characteristics of a memory component can be associated with the endurance of the memory component to store data. When data is written to and/or erased from a memory cell of a memory component, the memory cell can be damaged. As the number of write operations and/or erase operations performed on a memory cell increases, the probability that the data stored at the memory cell including an error increases and the memory cell is increasingly damaged. A characteristic associated with the endurance of the memory component is the number of write operations or a number of program/erase operations performed on a memory cell of the memory component. If a threshold number of write operations performed on the memory cell is exceeded, then data can no longer be reliably stored at the memory cell as the data can include a large number of errors that cannot be corrected. Different media types can also have difference endurances for storing data. For example, a first media type can have a threshold of 1,000,000 write operations, while a second media type can have a threshold of 2,000,000 write operations. Accordingly, the endurance of the first media type to store data is less than the endurance of the second media type to store data.

Another characteristic associated with the endurance of a memory component to store data is the total number of bytes written to a memory cell of the memory component. Similar to the number of write operations, as new data is written to the same memory cell of the memory component, the memory cell is damaged and the probability that data stored at the memory cell includes an error increases. If the total number of bytes written to the memory cell of the memory component exceeds a threshold number, then the memory cell can no longer reliably store data.

Another characteristic associated with a memory component is skew data corruption (SDC). SDC refers to the phenomenon of unbalanced shift of cells from one state to the other state caused by partial write. A partial write results from a number of the memory cells written as a first state and read as a second state (e.g., shift from low-voltage (LV) to high-voltage (HV) state or shift from HV to LV state). The major cause of SDC is corruptive reads (partial write HV to LV, or LV to HV where such partial write direction is dependent on memory type) from a read voltage being applied too much to the opposite direction of the partial write effect. In some cases, due to cycling wear, cell variations, disturbs of various sources, temperature, or the like, the tails of state distributions overlap. In other cases, the state distributions have complicated shapes and behaviors that change as a function of time, cycling wear, workload pattern, and device status. The distribution overlap and these changes in the state distributions can cause partial writes inevitably to happen in the data, causing the unbalanced shift of cells from one state to the other. It is possible that one read voltage is insufficient to read successfully the data (while not causing SDC), but the next read voltage becomes a corruptive read and causes SDC.

Conventional memory sub-systems generally do not identify occurrences of SDC and do not implement schemes to remedy the effects caused by SDC. No characteristics of SDC are typically used in conventional memory sub-systems to identify and remedy the occurrence of SDC. However, high raw bit error rates (RBER), caused by SDC, can greatly compromise the cells' robustness to other noises. As a result, the conventional memory sub-systems usually invoke extra error recovery handling to correct the errors caused by SDC. The extra error recovery handling can result in loss of Quality of Service (QoS), including latency, throughput, or the like. As a result, the conventional memory sub-system typically cannot manage the memory component with respect to SDC.

Aspects of the present disclosure address the above and other deficiencies by using a one-direction ERF when a partial write occurs and using a refresh write operation responsive to a directional error bit count satisfying a threshold criterion, as described herein. Such a memory sub-system can reduce costs by managing corruptive reads in the memory components, to identify an occurrence of SDC, remedy the effects of SDC, or both. Furthermore, the use of the memory sub-system having multiple memory components with SDC management can result in maintaining the cells' robustness to other noise, reduce extra error recovery handling by reducing the errors caused by partial writes, and maintain or improve the QoS, including latency, throughput, or the like. Described herein are embodiments related to one-direction ERF operations on memory components of memory systems. A processing device can determine if a read operation has caused or suffered from a partial write and can perform a refresh write when necessary. When a read operation is successfully decoded from the read operation, the processing device can determine a directional error bit count (EBC) of successfully decoded data obtained from the read operation. When a read operation is not successfully decoded, the processing device can determine the EBC from its ERF. Based on the directional EBC of the successfully decoded data or its ERF, the processing device can determine if the read operation has caused or suffered from a partial write and can perform a refresh write if necessary. The partial write results from a number of the memory cells written as a first state and read as a second state. The processing device performs a one-direction ERF on the memory cells by monotonically adjusting a read voltage level for one or more re-read operations from a first discrete read voltage level towards a second read voltage level in a first direction until the data from the one or more re-read operations is successfully decoded. The first direction corresponds to an opposite direction of a state shift of the partial write. Additional details of the one-direction ERF and the refresh write operation are described in more detail below.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a one-direction ERF component 113 that can be used to identify and minimize skew data corruption (SDC) caused by corruptive reads in one or more memory cells of a memory component. In some embodiments, the controller 115 includes at least a portion of the one-direction ERF component 113. For example, the controller 115 can include a processor 117 (processing device) configured to execute instructions stored in local memory 119 for performing the operations described herein. In some embodiments, the one-direction ERF component 113 is part of the host system 120, an application, or an operating system.

The one-direction ERF component 113 can determine that data from a read operation on a group of cells of any one of the memory components 112A to 112 of the memory sub-system 110A is not successfully decoded because of a partial write of the data. As described herein, the partial write results from a number of the memory cells written as a first state and read as a second state (e.g., shift from LV to HV state for Type II memory or shift from HV to LV state for Type I memory). At LV state, a relatively lower external voltage can turn on the cell and, at HV state, a relatively higher voltage is needed to turn on the cell. When reading a cell, an external voltage V at a level is applied such that it is high enough to turn on the LV cell or is not high enough to turn on the HV cell. The one-direction ERF component 113 can perform a one-direction ERF on the memory cells by monotonically adjusting a read voltage level for one or more re-read operations from a first discrete read voltage level towards a second read voltage level in a first direction until the data from the one or more re-read operations is successfully decoded. The first direction corresponds to an opposite direction of a state shift of the partial write. The one-direction ERF component 113 can also select the read voltage level of a corresponding re-read operation of the one or more re-read operations that is successfully decoded. The one-direction ERF component 113 can identify an occurrence of skew data corruption (SDC) in the data caused by characteristics in the memory cells. Selection of the read voltage level of the corresponding re-read operation widens a margin between the (read-decision based) first state and the second state for one or more subsequent operations on the memory cells. The one-direction ERF component 113 can calculate a directional error bit count (EBC), the directional EBC indicating the number of memory cells that is written as the first state and read as the second state. The one-direction ERF component 113 can compare the directional EBC against a directional EBC threshold criterion. The one-direction ERF component 113 can perform a refresh write of the data responsive to the directional EBC satisfying the directional EBC threshold criterion. The directional EBC can be used as an indicator of the SDC when the data is successfully decoded. The one-direction ERF, performed by the one-direction ERF component 113, identifies an occurrence of SDC in the data caused by characteristics in the memory cells. Further details with regards to the operations of the one-direction ERF component 113 are described below.

Figure 2:
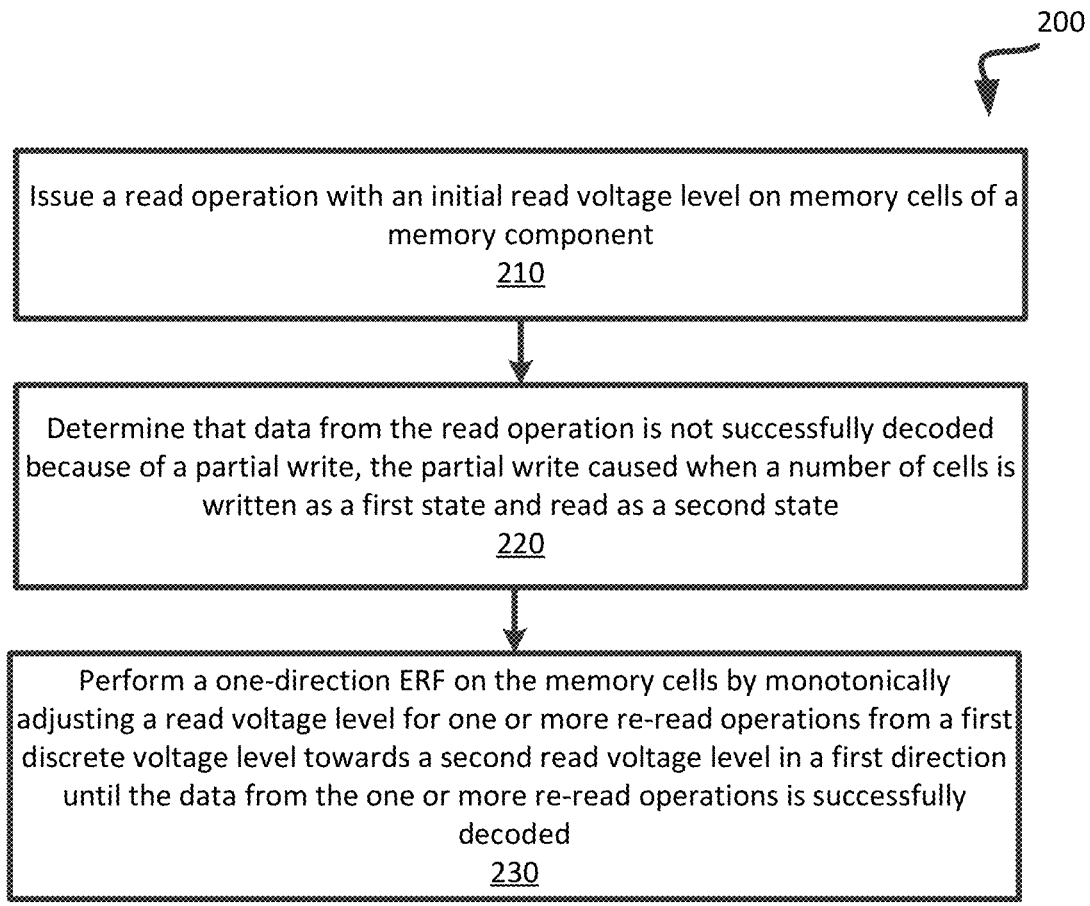
FIG. 2 is a flow diagram of an example method to perform a one-direction error recovery flow (ERF) after a partial write to avoid further skew data corruption (SDC) in accordance with some embodiments of the present disclosure.

FIG. 2 is a flow diagram of an example method 200 to perform a one-direction error recovery flow (ERF) after a partial write to avoid further skew data corruption (SDC) in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the memory one-direction ERF component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing device issues a read operation with an initial read voltage level on a group of memory cells of the memory component. At operation 220, the processing device determines that data from the read operation is not successfully decoded because of a partial write of the data, wherein the partial write results from a number of the group of memory cells written as a first state and read as a second state. At operation 230, the processing device performs a one-direction ERF on the group of memory cells by monotonically adjusting a read voltage level for one or more re-read operations from a first discrete read voltage level towards a second read voltage level in a first direction until the data from the one or more re-read operations is successfully decoded. The first direction corresponds to an opposite direction of a state shift of the partial write.

In a further embodiment, the processing device select the read voltage level of a corresponding re-read operation of the one or more re-read operations that is successfully decoded and identifies an occurrence of SDC in the data caused by characteristics in the group of memory cells. The selection of the read voltage level of the corresponding re-read operation widens a margin between the read-decision-based first state and the second state for one or more subsequent operations on the group of memory cells. In another embodiment, the processing device calculates a directional EBC, which indicates the number of group of memory cells that is written as the first state and read as the second state. The processing device compares the directional EBC against a directional EBC threshold criterion and performs a refresh write of the data responsive to the directional EBC satisfying the directional EBC threshold criterion. The processing device can use the directional EBC as an indicator of the SDC when the data is successfully decoded. The one-direction ERF identifies an occurrence of SDC in the data caused by characteristics in the group of memory cells. It should be noted that, in the case of Type I memory, the second state is a low voltage (LV) state, and can be assigned to a logical 1 (or a logical 0), and the first state a high voltage (HV) assigned to a logical 0 (or a logical 1). Alternatively, the second state is a HV state and the first state a LV state for a Type II memory.

Although the embodiments described above with respect to FIG. 2 are directed to a scenario where an original read operation has failed and ERF is invoked to successfully decode the data, in other embodiments, the processing device can determine if a read operation has caused or suffered from a partial write and can perform a refresh write when necessary. When a read operation is successfully decoded from the read operation, the processing device can determine an EBC of successfully decoded data obtained from the read operation. When a read operation is not successfully decoded, the processing device can determine the EBC from its ERF as set forth above. Based on the directional EBC of the successfully decoded data or its ERF, the processing device can determine if the read operation has caused or suffered from a partial write and can perform a refresh write if necessary.

It should be noted a read operation can be too much away opposite to the partial write direction or along that direction. In the first case, the read operation can cause SDC and, at this point, the decoder can either succeed or fail. When it fails, the ERF can be performed. In the second case, no SDC will be incurred and the decoder can either succeed or fail. When it fails, the ERF can be performed. In other words, once a read operation fails and enters ERF, it could be due to either the read voltage is too much away opposite to the partial write direction or along it. In the first case, the SDC is already caused by the original read operation and one-directional ERF cannot avoid the SDC, but can avoid further possible SDC (which could be possibly caused by an unoptimized ERF scheme, e.g. using a voltage opposite to the partial write direction even further away from the original read voltage. As described in more detail below with respect to FIG. 3, there are different possible outcomes and handlings of a read operation and ERF, if any. For example, a read operation can directly succeed decoding and the processing device can determine whether the EBC satisfies a directional EBC threshold, which indicates that that the partial write has been caused by the original read, causing a refresh write to be performed.

Figure 3:
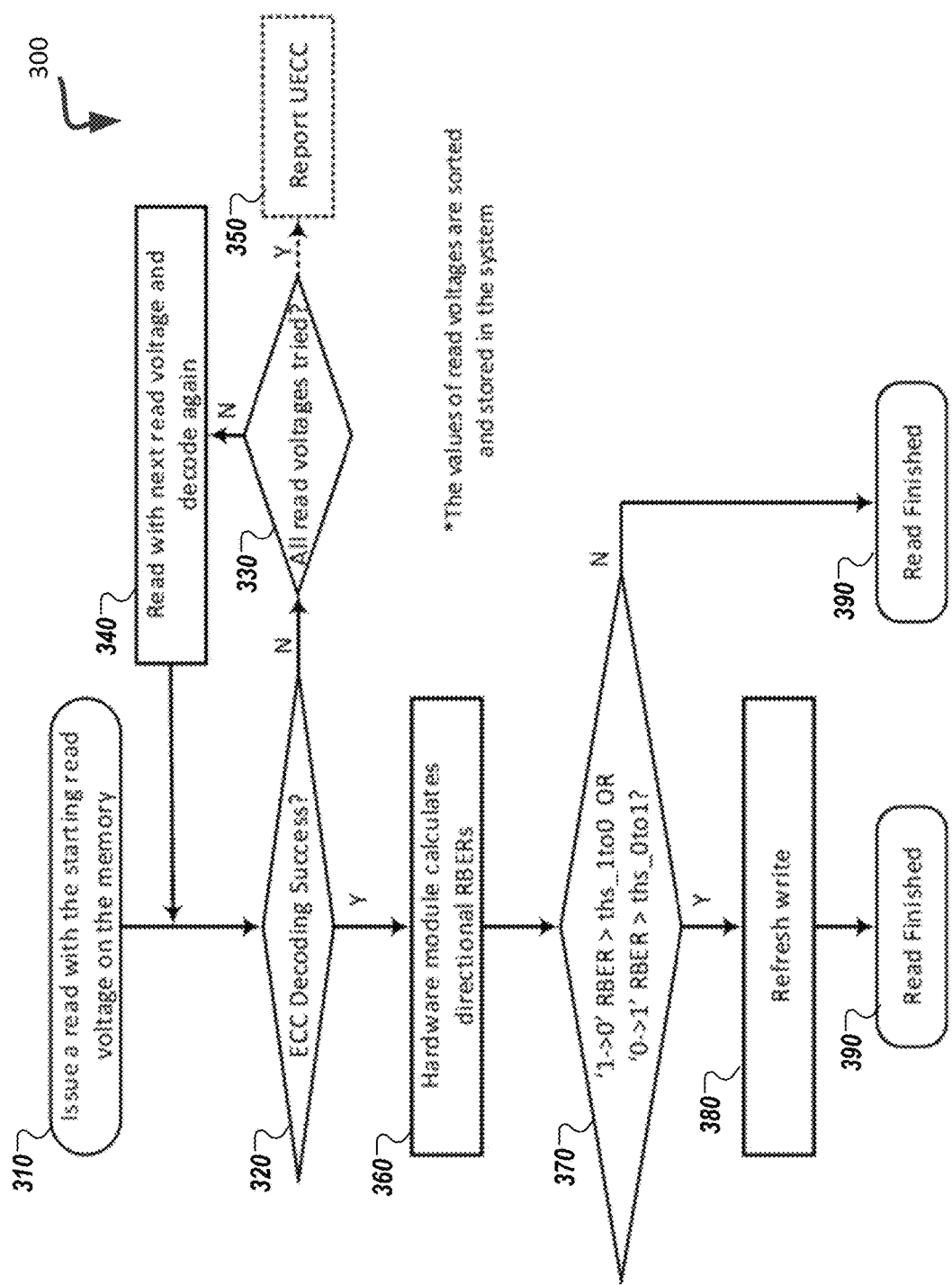
FIG. 3 is a flow diagram of an example method to detect SDC after a read in accordance with some embodiments of the present disclosure.

FIG. 3 is a flow diagram of an example method 300 to detect and minimize SDC caused by corruptive read in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the memory one-direction ERF component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing device issues a read operation with a starting read voltage on a memory component. At operation 320, the processing device determines whether data from the read operation is successfully decoded. At operation 330, the processing device, when the data from the read operation is not successfully decoded at operation 320, the processing device, at operation 330, performs a one-direction ERF on the memory component until the data is successfully decoded. In particular, at operation 330, the processing device can check whether all read voltages have been tried to read the data from the memory component. In a first instance, the processing device proceeds to operation 340. At operation 340, the processing device adjusts the read voltage used at operation 310 to a second read voltage level and issue a second read operation with the second read voltage on the memory component. The processing device determines whether the data from the second read operation is successfully decoded (operation 320). When the data is not successfully decoded from the second read operation at operation 320, the processing device checks whether all read voltages have been tried at operation 330. If not, the processing device adjusts the second read voltage used previously to a third read voltage and issue a third read operation with the third read voltage on the memory component at operation 340. The processing device determines whether the data is successfully decoded from the third read operation at operation 320. The processing device reports an uncorrectable error correction failure (e.g., uncorrectable error correction code (UECC)) at operation 350 if the data is not successfully decoded at operation 320 and it has been determined that all read voltages have been tried at operation 330. Once the data is successfully decoded at operation 320, the processing device calculates a directional EBC at operation 360 (whether 0->1 or 1->0 directional EBC is calculated depends on memory type). At operation 370, the processing device compares the directional EBC against a directional EBC threshold criterion. It should be noted that the directional EBC threshold criterion depends on the memory device (e.g., whether 0->1 threshold or 1->0 threshold is used depends on memory type). If the directional EBC satisfies the directional EBC threshold criterion at operation 370, the processing device deems SDC has happened and performs a refresh write of the data at operation 380 to reduce/minimize SDC, and the read operation is finished at operation 390. If the directional EBC does not satisfy the directional EBC threshold criterion at operation 370, the processing device finished the read operation at operation 390.

As set forth above, the processing device can determine if a read operation has caused or suffered from a partial write and can perform a refresh write when necessary. When a read operation is successfully decoded from the read operation, the processing device can determine an EBC of successfully decoded data obtained from the read operation. When a read operation is not successfully decoded, the processing device can determine the EBC from its ERF. Based on the directional EBC of the successfully decoded data or its ERF, the processing device can determine if the read operation has caused or suffered from a partial write and can perform a refresh write if necessary.

In a further embodiment, to perform the one-direction ERF, the processing device issues a second read operation with a second read voltage on the memory component. In some cases, the second read voltage is a highest voltage of the discrete read voltages available when the partial write is in one direction. When a third read operation is issued with a third read voltage, the third read voltage is lower than the second read voltage (highest available read voltage). In other cases, the second read voltage is a lowest voltage of the discrete read voltages available when the partial write is in another direction. In these cases, when a third read operation is issued with a third read voltage, the third read voltage is higher than the second read voltage (lowest available read voltage). In this manner, the processing device monotonically adjusts the read voltage level, starting at a highest or lowest available read voltage corresponding to the direction of the partial write. For example, the processing device can further determine that the third read operation is not successfully decoded and issue a fourth read operation with a fourth read voltage that is either lower or higher than the third read voltage, depending on the direction of the partial write. In other embodiments, there may be fifth, sixth, seventh read operations, and so on, with corresponding fifth, sixth, seventh read voltages, and so on.

In a further embodiment, to perform the one-direction ERF in response to a partial write caused by a number of memory cells written as a first state and read as a second state, the processing device monotonically adjusts a read voltage for one or more re-read operations from a first discrete read voltage towards a second read voltage in a first direction until the data from the one or more re-read operations is successfully decoded, the first direction corresponding to an opposite direction of a state shift of the partial write. As described herein, the processing device can determine that the data is not successfully decoded after all available read voltages for one or more re-read operations are tried and can report an UECC failure of the memory cells of the memory component.

The following description is directed to a single-level cell (SLC) that can store a 1-bit value and can be programmed to one of two voltages states, hereinafter referred to as a low voltage (LV) state and high voltage (HV) state or simply second state and first state, respectively. The embodiments described herein can be used in other cell types, such a multi-level cells (MLCs) that store N-bit value in each cell with four or more possible states. Each state represents a different value and can be assigned a voltage window within the range of all possible threshold voltages. The memory cell stores data as the threshold voltage of each cell. Due to variations across program operations and variations of characteristics of the memory cells, the threshold voltage of memory cells programmed to the same state is initially distributed across this voltage window, such as illustrated in FIG. 4A.

Figure 4A:
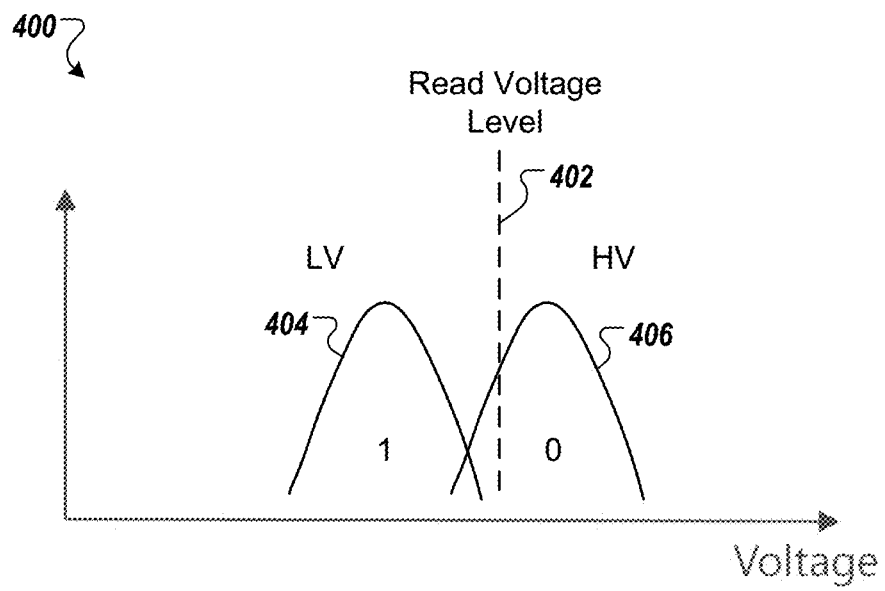
FIG. 4A is a graph that illustrates a read voltage level between two state distributions that causes a partial write in accordance with some embodiments of the present disclosure.

FIG. 4A is a graph 400 that illustrates a read voltage level 402 between two state distributions 404, 406 that causes a partial write 408 in accordance with some embodiments of the present disclosure. The graph 400 shows the threshold voltage distribution of single-level cells (SLCs) of a memory component. The threshold voltage distributions may represent a group of cells, such as a wordline or a group of wordlines, a block of a group of wordlines, or the like. The x-axis shows the threshold voltage, which spans a certain voltage range. The y-axis shows the probability density of each voltage level across all memory cells being represented. The threshold voltage distribution (also referred to as Vt distribution or programming distribution) of each threshold voltage state can be represented as a probability density curve that spans over the state's voltage window. In particular, a second state distribution 404 corresponds to a second state, which is labeled as an LV state and a corresponding bit value of "1," and a first state distribution 406 corresponds to a first state, which is labeled as HV state and a corresponding bit value of "0." It should be noted that in other embodiments the bit values can be mapped to different states, such as LV state corresponds to a bit value of "0" and HV state corresponds to a bit value of "1."

Data can be read from a memory component by applying read reference voltages onto each cell, to sense the cell's threshold voltage. To read the value stored in a single-level cell, only the state with a bit value of 1 needs to be distinguished from the state with a bit value of 0. A single read voltage level 402, also referred to as read voltage or read reference voltage, is used to distinguish between the two states, LV and HV states. Although described with respect to two state distributions of a single-level cell, similar approaches can be used in multi-level cells. To read the state of the memory cell, a read operation can apply the read voltage level 402 to the memory cell. Cells from multiple wordlines (WL) can be connected in series on a shared bitline (BL) to a sense amplifier, which drives the value that is being read from the block onto the memory channel.

Several different types of errors can be introduced during the programming and erasing of cells, referred to as P/E cycling process. For example, there are P/E cycling errors, program errors, data retention errors, errors due to read disturbs, partial writes, and the like. As described above, the threshold voltage of cells programmed to the same state is distributed across a voltage window due to the variation across program operations and across different cells. The minimum cell-opening voltages of LV cells form a statistical distribution, as shown as the second state distribution 404. The minimum cell-opening voltages of HV cells form a statistical distribution, as shown as the second state distribution 406. Due to cycling wear, cell variations, disturbs of various sources, temperature, or the like, LV and HV state distributions can partially overlap as shown in the graph 400 of FIG. 4A.

Skew data corruption (SDC) refers to the phenomenon of unbalanced shift of cells from one state to the other state. In some type of memory, the read operation entails a partial write trait, due to the physical characteristics of memory. The partial write is a one-sided write where one state is wrongly pushed to the other state. The major cause of SDC is corruptive reads where the read voltage is applied too much to the opposite direction of the partial write effect. An example of SDC is caused by corruptive reads (partial write HV to LV), as shown in FIG. 4B.

Figure 4B:
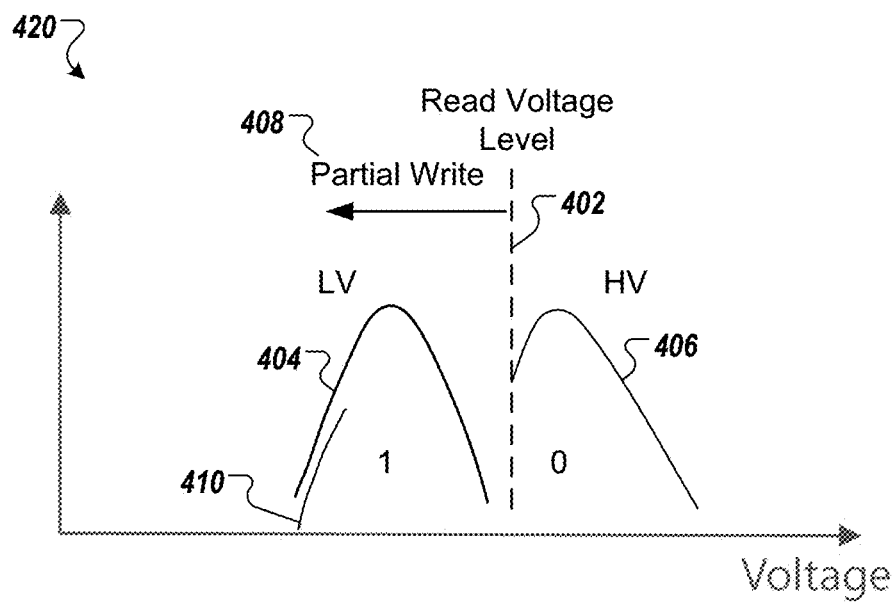
FIG. 4B is a graph that illustrates a partial write effect by the read level voltage between the two state distributions in FIG. 4A, in accordance with some embodiments of the present disclosure.

FIG. 4B is a graph 420 that illustrates a partial write effect 410 by the read level voltage between the two state distributions in FIG. 4A, in accordance with some embodiments of the present disclosure. As shown, the read voltage level 402 is such that it causes some cells that are written as a first state, HV state in the illustrated embodiment, to be read as a second state, LV state in the illustrated embodiment. This result is referred to as the partial write 408 that has a partial write effect 410. The partial write effect 410 is the portion of HV cells that are wrongly pushed to LV state. More specifically, cells that are written to the HV state, corresponding to a bit of 0, will be read as LV state, corresponding to a bit of 1. The partial write 408 can also cause a read window widening effect. The state distributions 404, 406 can have complicated shapes and behaviors as a function of time, cycling wear, workload pattern, device status, or the like, hence the tails of the state distributions 404, 406 are overlapped, as shown in FIG. 4A. In additional to the distribution overlap, there are also other reasons causing SDC, which make SDC unavoidable during normal device usage.

Conventional memory systems do not identify occurrences of SDC and do not try to reduce or eliminate the negative effects of SDC. That is no characteristics of SDC are measured or utilized by the conventional memory systems to reduce errors caused by SDC. For example, SDC results in high raw bit error rate (RBER). The high RBER caused by SDC affect the cell's robustness to other noises, can invoke unnecessary extra error recovery handling, and can decrease quality of services (QoS), including latency, throughput, or the like. In certain memory systems, a limited number of read voltages are used. It is possible that one read voltage is insufficient to read successfully the data, while not causing SDC, but the next read voltage becomes a corruptive read and causes SDC.

Figure 5A:
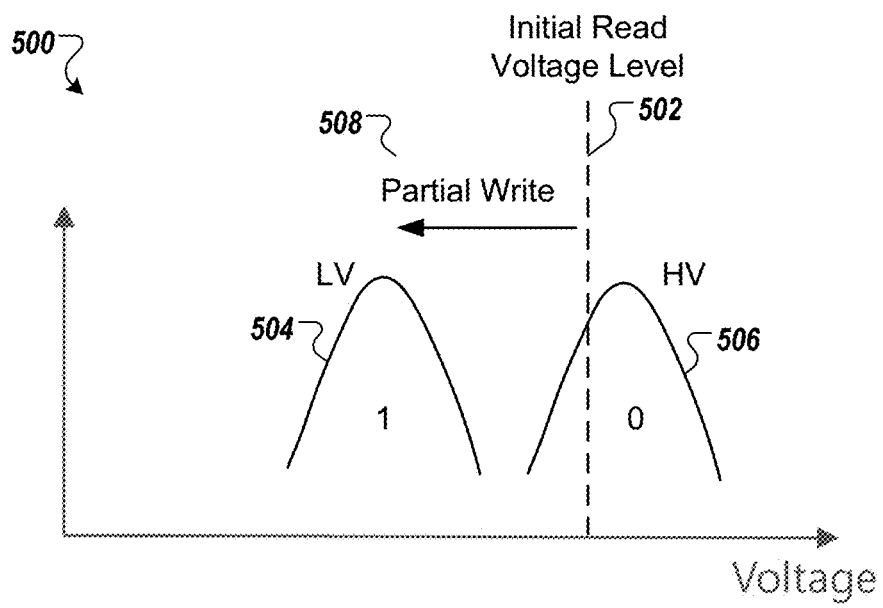
FIG. 5A is a graph that illustrates a read voltage level between two state distributions that causes a partial write in a first direction in accordance with some embodiments of the present disclosure.
Figure 5B:
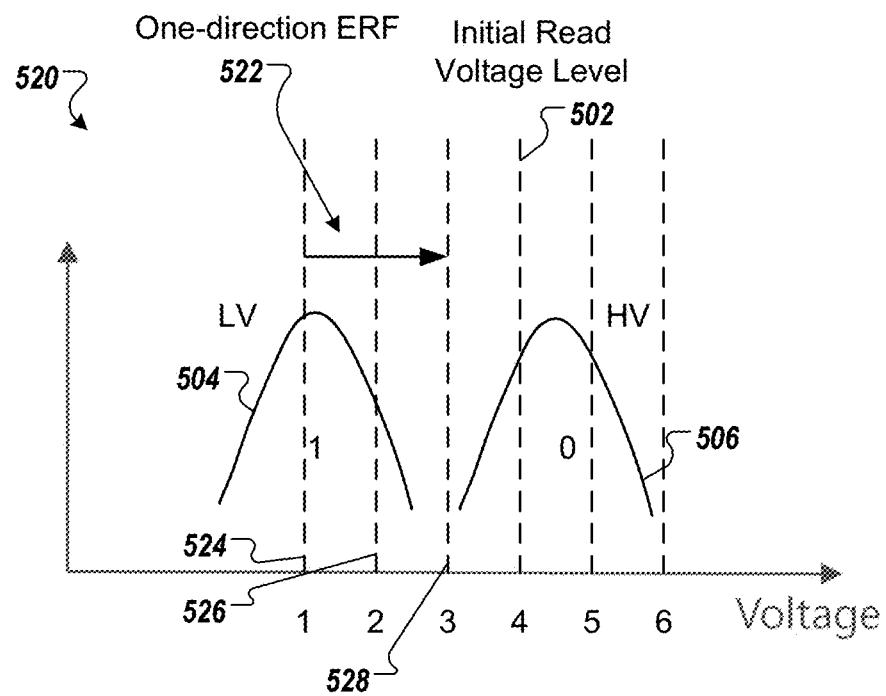
FIG. 5B is a graph that illustrates a one-direction ERF to avoid further aggravation of partial write by adjusting the read level voltage in an opposite direction and/or perform a refresh write operation to reduce an effect of the partial write, in accordance with some embodiments of the present disclosure.
Figure 5C:
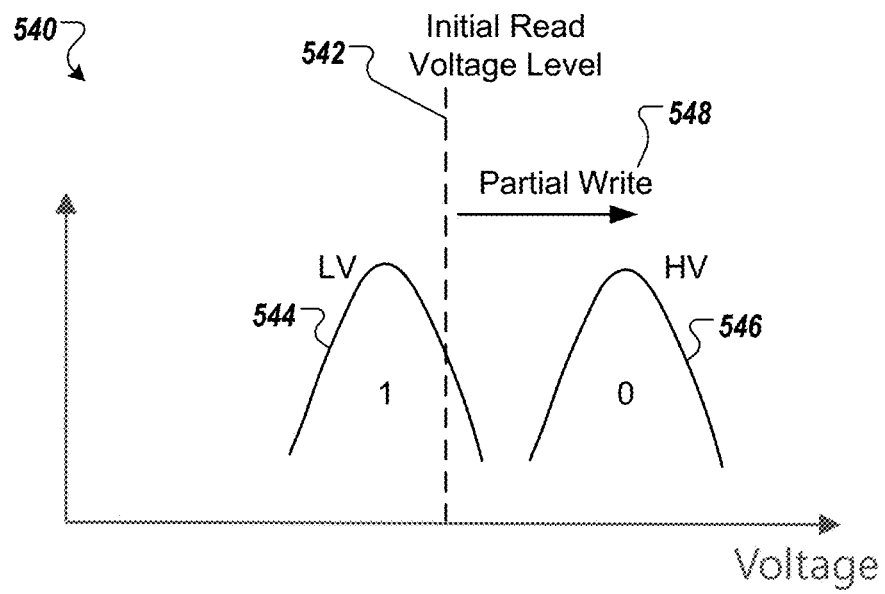
FIG. 5C is a graph that illustrates a read voltage level between two state distributions that causes a partial write in a second direction in accordance with some embodiments of the present disclosure.
Figure 5D:
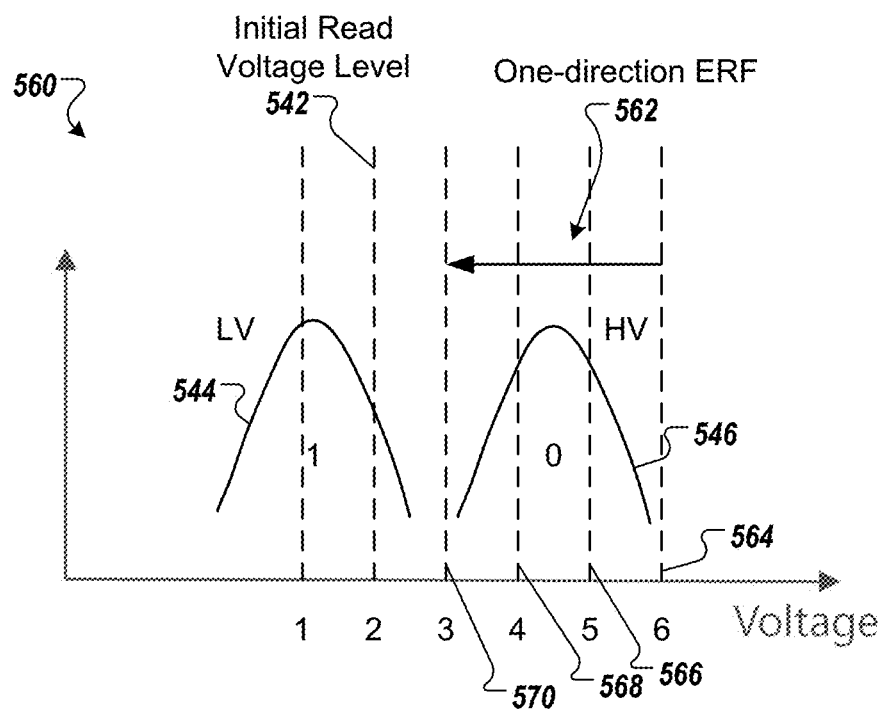
FIG. 5D is a graph that illustrates a one-direction ERF to avoid further aggravation of partial write by adjusting the read level voltage in an opposite direction, in accordance with some embodiments of the present disclosure.

The embodiments described herein are directed to one-direction ERF in which the system does ERF with monotonically increasing (or decreasing) read voltages, depending on a direction of the partial write. The system uses decoder statistics (e.g., ECC decoder stats) to stop the ERF at the right read voltage and identify an occurrence of SDC. When the ERF stops at or near an optimal read level, the data is decoded and in the meantime the partial write effect of the read operation widens the margin between the two states. It should be noted that the one-direction ERF can maximally avoid SDC, as compared to other ERF strategies that do not identify or remedy SDC. As described herein, the system can also perform a refresh write operation in the event that read voltages are too high (or too low if the ERF is performed in the other direction) due to the fact that finite number of voltage levels are available for use or due to other reasons. The system can rewrite the data based on the decoder statistics. For example, when decoding the data succeeds in the original read operation or after one-direction ERF, a directional error bit count (also referred to as directional RBER) can be calculated (based on raw media data in the original read operation) and used as an indicator of SDC. For example, the number of '0→1' bit errors, where the cell is written as 0 but wrongly read as 1, can be determined. Similarly, the number of '1→0' bit errors, where the cell is written as 1 but wrongly read as 0, can be determined. In the case of Type I memory and LV represents 1 and HV represents 0, the number of '0→1' bit errors, referred to as directional error bit count (EBC) is recorded and compared against a system-preset threshold 'ths_0to1', referred to as directional EBC threshold criterion. Similarly, for Type II memory and LV represents 1 and HV represents 0, the number of '1→0' bit errors is recorded and compared against a system-preset threshold 'ths_1to0'. Responsive to the directional bit error count satisfying the directional EBC threshold criterion, a refresh write operation is performed to refresh write the data (e.g., codeword). If the directional bit error count does not satisfy the directional EBC threshold criterion, a refresh write operation is not performed. FIGS. 5A-5B illustrate an embodiment of a partial write in a first direction and a corresponding one-direction ERF in an opposite direction in response to the partial write and FIGS. 5C-5D illustrate an embodiment of a partial write in a second direction and a corresponding one-direction ERF in an opposite direction in response to the partial write.

FIG. 5A is a graph 500 that illustrates a read voltage level 502 between two state distributions 504, 506 that causes a partial write 508 in a first direction in accordance with some embodiments of the present disclosure. The graph 500 shows a second state distribution 504 of memory cells of a memory component programmed to a second state (e.g., LV) and a first state distribution 506 of memory cells of the memory component programmed to a first state (e.g., HV). The x-axis shows the threshold voltage, which spans a certain voltage range. The y-axis shows the probability density of each voltage level across all memory cells being represented. The second state distribution 504 can be assigned a bit value of "1" and the first state distribution 506 can be assigned a bit value of "0." It should be noted that in other embodiments the bit values can be mapped to different states, such as LV state corresponds to a bit value of "0" and HV state corresponds to a bit value of "1."

As described above, data can be read from a memory component by applying read reference voltages onto each cell, to sense the cell's threshold voltage. During a read operation, an initial read voltage level 502 is used to read the memory cells of the memory component. As described above, due to cycling wear, cell variations, disturbs, temperature, or the like, the second state distribution 504 and first state distribution 506 may have shifted such that the initial read voltage level 502 causes a partial write 508 that would cause SDC. The partial write 508 results from a number of memory cells written as a first state and read as a second state. For example, when reading an eight-memory-cell data, the data on the media are read as 1110 1111, and after decoding (possibly entering one-direction ERF), the correct written data is determined to be 0000 1111, hence there are 3 '0->1' bit errors, then we know that read voltage 502 is too high that have caused a large number of '0->1' bit errors and the partial write 508 as a result. Unlike the conventional memory systems, the data would be recovered using an error recovery flow without identifying an occurrence of SDC caused by the partial write, the embodiments described herein perform a one-direction ERF to identify the partial write 508 and/or perform a refresh write operation to reduce/minimize the effects of the partial write 508 as described below with respect to FIG. 5B.

FIG. 5B is a graph 520 that illustrates a one-direction ERF 522 to avoid the aggravation of partial write 508 by adjusting the read level voltage in an opposite direction and/or perform a refresh write operation to reduce/minimize an effect of the partial write 508, in accordance with some embodiments of the present disclosure. When the data from the read operation with the initial read voltage level 502 is not successfully decoded, a one-direction ERF 522 is performed in which a read voltage level is monotonically adjusted for one or more re-read operations from a first discrete voltage level 524 towards a second discrete read voltage level 528 in an opposite direction as the first direction until the data from the one or more re-read operations is successfully decoded. The direction of the one-direction ERF 522 corresponds to an opposite direction of a state shift of the partial write 508. As illustrated, the one-direction ERF 522 starts with a lowest available read voltage level, labeled as read voltage level 524, and monotonically increases to a read voltage level 526, and also monotonically increase to a read voltage level 528. In this embodiment, there are six available read voltage levels. However, in other embodiments, other numbers of available read voltage levels can be used based on the particular implementation. It should also be noted that in other embodiments, the one-direction ERF 522 does not use the lowest read voltage level available, but could use an intervening read voltage level that is not the lowest. For example, the memory controller may have prior knowledge that allows the intervening read voltage level to be used as the first read voltage level in the one-direction ERF 522.

For the given example above, where the data value 0000 1111 that is written and initially read as 1110 1111, if the initial read operation fails decoding, the one-direction ERF 522 can perform one or more re-read operations until the data is successfully decoded. For example, after initial read decoding or with the one-direction ERF 522, the data can be correctly decoded as 0000 1111.

In some cases, once the data is successfully decoded, the system selects the read voltage level of the corresponding re-read operation that results in the data being successfully decoded and identifies an occurrence of SDC in the data caused by characteristics of the memory cells, as opposed to errors caused by other characteristics of the memory cells. In this case, the read voltage level 528 is selected. Selecting the read voltage level 528 widens a margin between the second state distribution 504 and the first state distribution 506 for one or more subsequent operations on the memory cells. A valley width between the second state distribution 504 and the first state distribution 506 can be a read window budget (RWB). RWB is an indication of how much margin a part has to read data without errors. The greater the RWB, the more margin that exists. The best RBER exists when the read voltage level is centered or near centered between the two state distributions.

In some embodiments, the system calculates a directional EBC that indicates the number of memory cells written as the first state and read as the second state. For the example above where the data value 0000 1111 is written; assume that the raw read data value is 1110 1111, and the raw read data can be successfully recovered based on original read data or ERF, after data recovery the correct data is 0000 1111, hence the directional EBC is 3 (considering only 0->1 errors here since it is Type I memory). The directional EBC is then compared against a directional EBC threshold criterion. The system performs a refresh write of the data responsive to the directional EBC satisfying the directional EBC threshold criterion. The directional EBC can also be used as an indicator of the SDC when the data is successfully decoded. Although the depicted embodiment illustrates the second state as being a LV state and the first state as being a HV state, in other embodiments, the second state may be a HV state and the first state is a LV state. Similarly, although the depicted embodiment illustrates the second state as being assigned a "1" and the first state as being assigned a "0," in other embodiments, the second state may be assigned "0" and the first state may be assigned "1."

It should be noted that FIG. 5B shows the one-direction ERF 522 performed in an opposite direction to a first direction of the partial write 508. In other embodiments, the partial write can be in a second direction, such as illustrated and described below with respect to FIG. 5C. In response to the partial write in the second direction, a one-direction ERF can be performed in an opposite direction, such as illustrated and described below with respect to FIG. 5D.

FIG. 5C is a graph 540 that illustrates a read voltage level 542 between two state distributions 544, 546, that causes a partial write 548 in a second direction in accordance with some embodiments of the present disclosure. The graph 540 shows a first state distribution 544 of memory cells of a memory component programmed to a first state (e.g., LV) and a second state distribution 546 of memory cells of the memory component programmed to a second state (e.g., HV). The x-axis shows the threshold voltage, which spans a certain voltage range. The y-axis shows the probability density of each voltage level across all memory cells being represented. The first state distribution 544 can be assigned a bit value of "1" and the second state distribution 546 can be assigned a bit value of "0." It should be noted that in other embodiments the bit values can be mapped to different states, such as LV state corresponds to a bit value of "0" and HV state corresponds to a bit value of "1."

As described above, data can be read from a memory component by applying read reference voltages onto the control gate of each cell, to sense the cell's threshold voltage. During a read operation, an initial read voltage level 542 is used to read the memory cells of the memory component. As described above, due to cycling wear, cell variations, disturbs, temperature, or the like, the first state distribution 544 and second state distribution 546 may have shifted such that the initial read voltage level 542 causes a partial write 548 that would cause SDC. The partial write 548 results from a number of memory cells written as a first state and read as a second state. For example, a data value of 0000 1111 can be written to eight memory cells. However, when then the data is read, the raw read data values is 0000 1100 caused by the partial write 548. Unlike the conventional memory systems, the data would be recovered using an error recovery flow without identifying an occurrence of SDC caused by the partial write, the embodiments described herein perform a one-direction ERF to identify the partial write 548 and/or perform a refresh operation to reduce/minimize the effects of the partial write 548 as described below with respect to FIG. 5D.

FIG. 5D is a graph 560 that illustrates a one-direction ERF 562 to avoid further aggravation of partial write 548 by adjusting the read level voltage in an opposite direction, in accordance with some embodiments of the present disclosure. When the data from the read operation with the initial read voltage level 542 is not successfully decoded because of the initial read voltage level 542, resulting in the partial write 548 of the data, a one-direction ERF 562 is performed in which a read voltage level is monotonically adjusted for one or more re-read operations from a first discrete voltage level 564 towards a second read voltage level 570 in an opposite direction as the second direction until the data from the one or more re-read operations is successfully decoded. The direction of the one-direction ERF 562 corresponds to an opposite direction of a state shift of the partial write 548. As illustrated, the one-direction ERF 562 starts with a highest available read voltage level, labeled as read voltage level 564, and monotonically decreases to a read voltage level 566, monotonically decrease to a read voltage level 568, and ultimately monotonically decreases to the read voltage level 570. In this embodiment, there are six available read voltage levels. However, in other embodiments, other numbers of available read voltage levels can be used based on the particular implementation. It should also be noted that in other embodiments, the one-direction ERF 562 does not use the highest read voltage level available, but could use an intervening read voltage level that is not the highest. For example, the memory controller may have prior knowledge that allows the intervening read voltage level to be used as the first read voltage level in the one-direction ERF 562.

For the given example above, where the data value 0000 1111 that is written and initially read as 0000 1100, if the initial read operation fails decoding, the one-direction ERF 562 can perform one or more re-read operations until the data is successfully decoded. For example, after initial read decoding or with the one-direction ERF 562, the data can be correctly decoded as 0000 1111.

In some cases, once the data is successfully decoded, the system selects the read voltage level of the corresponding re-read operation that results in the data being successfully decoded and identifies an occurrence of SDC in the data caused by characteristics of the memory cells, as opposed to errors caused by other characteristics of the memory cells. In this case, the read voltage level 570 is selected. Selecting the read voltage level 570 widens a margin between the first state distribution 544 and the second state distribution 546 for one or more subsequent operations on the memory cells.

In some embodiments, the system calculates a directional EBC that indicates the number of memory cells written as the first state and read as the second state. For the example above where the data value 0000 1111 is written and the raw read data value is 0000 1100, the directional EBC is 2. The directional EBC is compared against a directional EBC threshold criterion. The system performs a refresh write of the data responsive to the directional EBC satisfying the directional EBC threshold criterion. The directional EBC can also be used as an indicator of the SDC when the data is successfully decoded.

As described above, embodiments of the memory systems can use a one-direction ERF, can identify SDC, can implement a remediate scheme to reduce or eliminate the effects of partial writes, and can implement a decision rule for starting a refresh write operation using the directional EBCs. The embodiments allow flexible adjustments during operation of SDC thresholds, namely the directional EBC thresholds described herein. The one-direction ERF can be a SDC-minimizing ERF strategy that effectively identifies occurrences of SDC. The in-time refresh operation can remediate SDC, thus improving cells' robustness. The embodiments may improve system QoS, including latency, throughput, or the like. The embodiments may be implemented in hardware, firmware, software, or any combination thereof.

Figure 6:
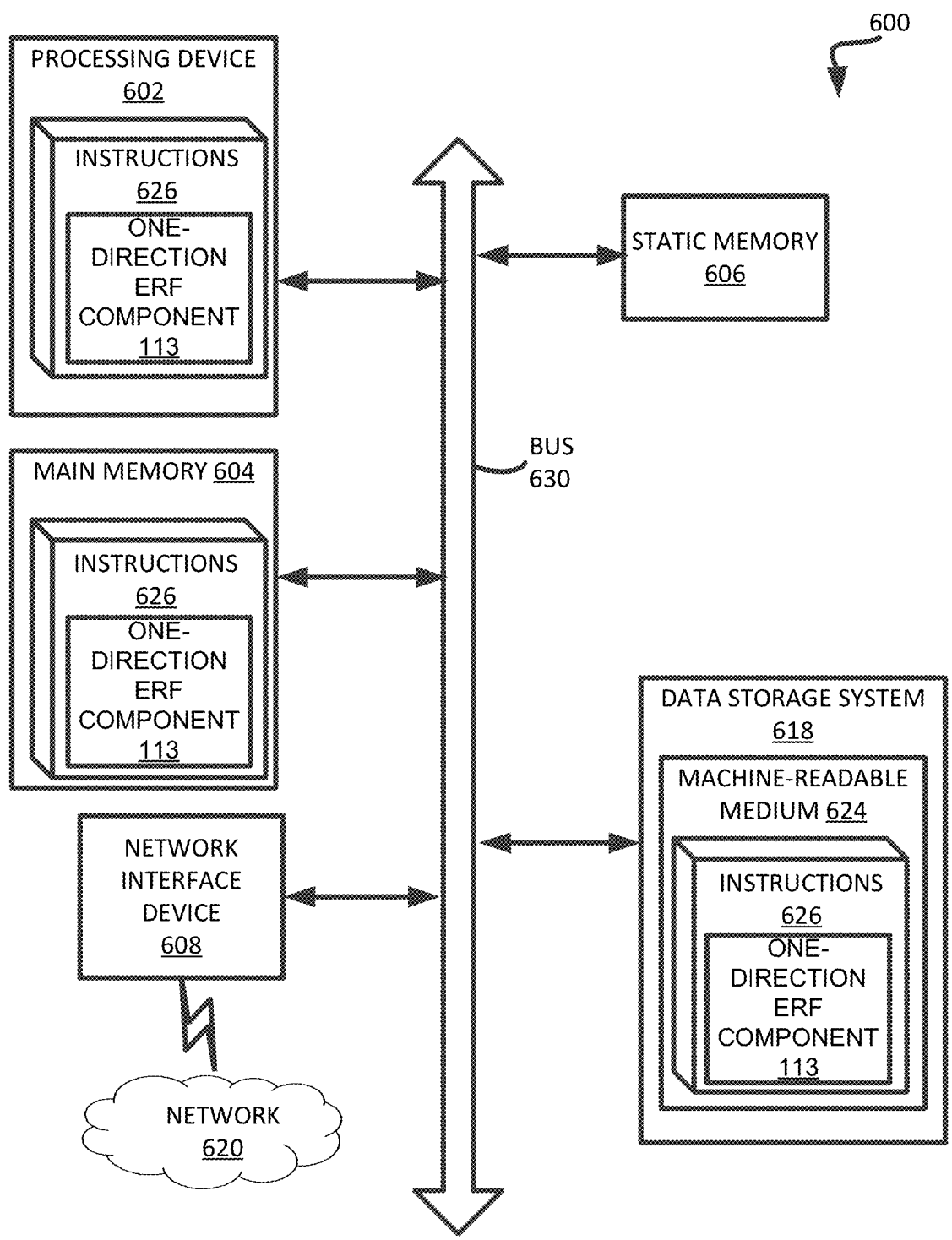
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the one-direction ERF component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to an ERF component (e.g., the one-direction ERF component 113 of FIG. 1). While the machine-readable storage medium 624 is shown in an example embodiment to be a single medium, the term "machine-readable storage medium" or "computer-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory component; and
a processing device, operatively coupled with the memory component, to:
issue a read operation with an initial read voltage level on a plurality of memory cells of the memory component;
determine that data from the read operation is not successfully decoded;
perform a one-direction error recovery flow (ERF) on the plurality of memory cells by monotonically adjusting a read voltage level applied to control gates of the plurality of memory cells for one or more re-read operations from a first read voltage level towards a second read voltage level until the data from the one or more re-read operations is successfully decoded;

calculate a directional error bit count (EBC), wherein the directional EBC indicates a number of the plurality of memory cells that are written as a first state and read as a second state; and perform a refresh write of the data responsive to the directional EBC satisfying a directional EBC threshold criterion.

2. The system of claim 1, wherein the processing device is further to:

select the read voltage level of a corresponding re-read operation of the one or more re-read operations that is successfully decoded; and identify an occurrence of skew data corruption (SDC) in the data caused by characteristics in the plurality of memory cells.

3. The system of claim 2, wherein selection of the read voltage level of the corresponding re-read operation widens a margin between the first state and the second state for one or more subsequent operations on the plurality of memory cells.

4. The system of claim 1, wherein the processing device is further to use the directional EBC as an indicator of the SDC when the data is successfully decoded.

5. The system of claim 1, wherein the one-direction ERF identifies an occurrence of skew data corruption (SDC) in the data caused by characteristics in the plurality of memory cells.

6. The system of claim 1, wherein the first state is a low voltage (LV) state and the second state is a high voltage (HV) state.

7. The system of claim 1, wherein the first state is a high voltage (HV) state and the second state is a low voltage (LV) state.

8. A method comprising:

issuing a read operation with an initial read voltage level on a plurality of memory cells of a memory component;

determining that data from the read operation is not successfully decoded;

performing a one-direction error recovery flow (ERF) on the plurality of memory cells by monotonically adjusting a read voltage level applied to control gates of the plurality of memory cells for one or more re-read operations from a first discrete read voltage level towards a second read voltage level until the data from the one or more re-read operations is successfully decoded;

calculating a directional error bit count (EBC), wherein the directional EBC indicates a number of the plurality of memory cells that are written as a first state and read as a second state; and performing a refresh write of the data responsive to the directional EBC satisfying a directional EBC threshold criterion.

9. The method of claim 8, further comprising:

selecting the read voltage level of a corresponding re-read operation of the one or more re-read operations that is successfully decoded; and identifying an occurrence of skew data corruption (SDC) in the data caused by characteristics in the plurality of memory cells.

10. The method of claim 9, wherein selecting the read voltage level of the read voltage level of the corresponding re-read operation widens a margin between the first state and the second state for one or more subsequent operations on the plurality of memory cells.

11. The method of claim 9, further comprising using the directional EBC as an indicator of the SDC when the data is successfully decoded.

12. The method of claim 8, wherein the one-direction ERF identifies an occurrence of skew data corruption (SDC) in the data caused by characteristics in the plurality of memory cells.

13. The method of claim 8, wherein the first state is a low voltage (LV) state and the second state is a high voltage (HV) state.

14. The method of claim 8, wherein the first state is a high voltage (HV) state and the second state is a low voltage (LV) state.

15. A non-transitory computer-readable storage medium storing instructions, which when executed by a processing device of a memory sub-system controller, cause the processing device to perform a plurality of operations comprising:

issuing a read operation with an initial read voltage level on a plurality of memory cells of a memory component;

determining that data from the read operation is not successfully decoded;

performing a one-direction error recovery flow (ERF) on the plurality of memory cells by monotonically adjusting a read voltage level applied to control gates of the plurality of memory cells for one or more re-read operations from a first discrete read voltage level towards a second read voltage level until the data from the one or more re-read operations is successfully decoded;

calculating a directional error bit count (EBC), wherein the directional EBC indicates a number of the plurality of memory cells that are written as a first state and read as a second state; and performing a refresh write of the data responsive to the directional EBC satisfying a directional EBC threshold criterion.

16. The non-transitory computer-readable storage medium of claim 15, wherein the plurality of operations further comprises:

selecting the read voltage level of a corresponding re-read operation of the one or more re-read operations that is successfully decoded; and identifying an occurrence of skew data corruption (SDC) in the data caused by characteristics in the plurality of memory cells.

17. The non-transitory computer-readable storage medium of claim 15, wherein the plurality of operations further comprises:

identifying an occurrence of skew data corruption (SDC) in the data using the directional EBC when the data is successfully decoded.

* * * * *